United States Patent
Lee (10) Patent No.: US 7,813,187 B2
(45) Date of Patent: Oct. 12, 2010

(54) MULTI-BIT FLASH MEMORY DEVICE AND PROGRAM METHOD THEREOF

(75) Inventor: Seung-Jae Lee, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 323 days.

(21) Appl. No.: 11/938,603

(22) Filed: Nov. 12, 2007

(65) Prior Publication Data

US 2008/0137415 A1    Jun. 12, 2008

(30) Foreign Application Priority Data

Dec. 11, 2006   (KR) ................. 10-2006-0125728

(51) Int. Cl.
*G11C 7/00* (2006.01)
(52) U.S. Cl. .................. 365/189.05; 365/230.08; 365/238.5; 365/239
(58) Field of Classification Search ............ 365/189.05, 365/238.5, 230.08, 239
See application file for complete search history.

(56) References Cited

U.S. PATENT DOCUMENTS

| | | | |
|---|---|---|---|
| 5,475,693 A | 12/1995 | Christopherson et al. | |
| 5,923,587 A | 7/1999 | Choi | |
| 6,082,056 A | 7/2000 | Hoberman | |
| 6,532,556 B1 | 3/2003 | Wong et al. | |
| 6,560,143 B2 | 5/2003 | Conley et al. | |
| 6,917,547 B2 | 7/2005 | Kanamori et al. | |
| 7,035,144 B2 | 4/2006 | Kim et al. | |
| 7,099,993 B2 | 8/2006 | Keeler | |
| 2006/0143368 A1 | 6/2006 | Lasser et al. | |
| 2006/0206751 A1* | 9/2006 | Honda | 714/5 |
| 2006/0268654 A1* | 11/2006 | Chae et al. | 365/230.08 |

FOREIGN PATENT DOCUMENTS

| | | |
|---|---|---|
| KR | 1998-027610 | 7/1998 |
| KR | 1020060051898 | 5/2006 |

OTHER PUBLICATIONS

English Abstract for Publication No. 1998-027610.
English Abstract for Publication No. 1020060051898.

* cited by examiner

*Primary Examiner*—Son Dinh
(74) *Attorney, Agent, or Firm*—F. Chau & Associates, LLC (57) ABSTRACT

A method for programming a flash memory device including a plurality of memory cells, each storing multi-bit data, includes reading data from selected memory cells. An error of the read data is detected and corrected. Input program data is programmed into the selected memory cells based upon the error-corrected read data.

20 Claims, 8 Drawing Sheets

| State | | IRD7 Result | Page4 '0' Program Result | Page4 '1' Program Result |
|---|---|---|---|---|
| 30 | Normal | 011 | 0011 | 1011 |
|  | Error | 010 | 0010 | 1010 |
| 40 | Normal | 010 | 0010 | 1010 |
|  | Error | 011 | 0011 | 1011 |

MULTI-BIT FLASH MEMORY DEVICE AND PROGRAM METHOD THEREOF

CROSS-REFERENCE TO RELATED APPLICATION

This application claims priority under 35 U.S.C. §119 to Korean Patent Application No. 10-2006-0125728 filed on Dec. 11, 2006, the entire contents of which are incorporated herein by reference.

BACKGROUND OF THE INVENTION

1. Technical Field

The present invention disclosed herein relates to a flash memory device and more particularly, to a multi-bit flash memory device and a program method thereof.

2. Discussion of the Related Art

Semiconductor memory devices may be volatile or non-volatile. Volatile memory devices may be written to and read from relatively quickly, but lose data when external power is discontinued. Nonvolatile memory devices retain data even after external power has been discontinued. Therefore, nonvolatile memory devices are employed to store data that should be retained regardless of whether power is supplied. Such nonvolatile memory devices include mask read-only memory (MROM), programmable ROM (PROM), erasable and programmable ROM (EPROM), electrically erasable and programmable ROM (EEPROM), and so forth.

Generally, it is not easy for a system using MROM, PROM and/or EPROM to update data stored therein. EEPROMs are widely employed in systems where data is frequently updated since they are electrically erasable and programmable. Flash EEPROMs offer higher integration density than conventional EEPROMs, and may thus be used in storage units with large storage capacity. In particular, NAND-type flash EEPROMs (hereinafter, referred to as 'NAND flash memory') have a particularly high integration density.

In recent years, with increasing demand for high-integration memory devices, multi-bit memory devices storing multiple bits of data in a unit cell are disclosed, for example, in U.S. Pat. No. 7,035,144 entitled "FLASH MEMORY DEVICE HAVING MULTI-LEVEL CELL AND READING AND PROGRAMMING METHOD THEREOF", U.S. Pat. No. 6,082,056 entitled "FLASH MEMORY DEVICE AND ARCHITECTURE WITH MULTI LEVEL CELLS", and U.S. Pat. No. 5,923,587 entitled "MULTI-BIT MEMORY CELL ARRAY OF A NON-VOLATILE SEMICONDUCTOR MEMORY DEVICE AND METHOD FOR DRIVING THE SAME", which are all incorporated herein by reference.

When storing 1-bit data in a memory cell, the memory cell is conditioned in one of two threshold-voltage distributions, for example, corresponding to either a data states '1' or a data state '0'. When storing 2-bit data in a memory cell, the memory cell is conditioned in one of four threshold voltage distributions. When storing 3-bit data in a memory cell, the memory cell is conditioned in one of eight threshold voltage distributions. Techniques are presently being developed for storing 4-bit data in a unit memory cell.

Figure 1:
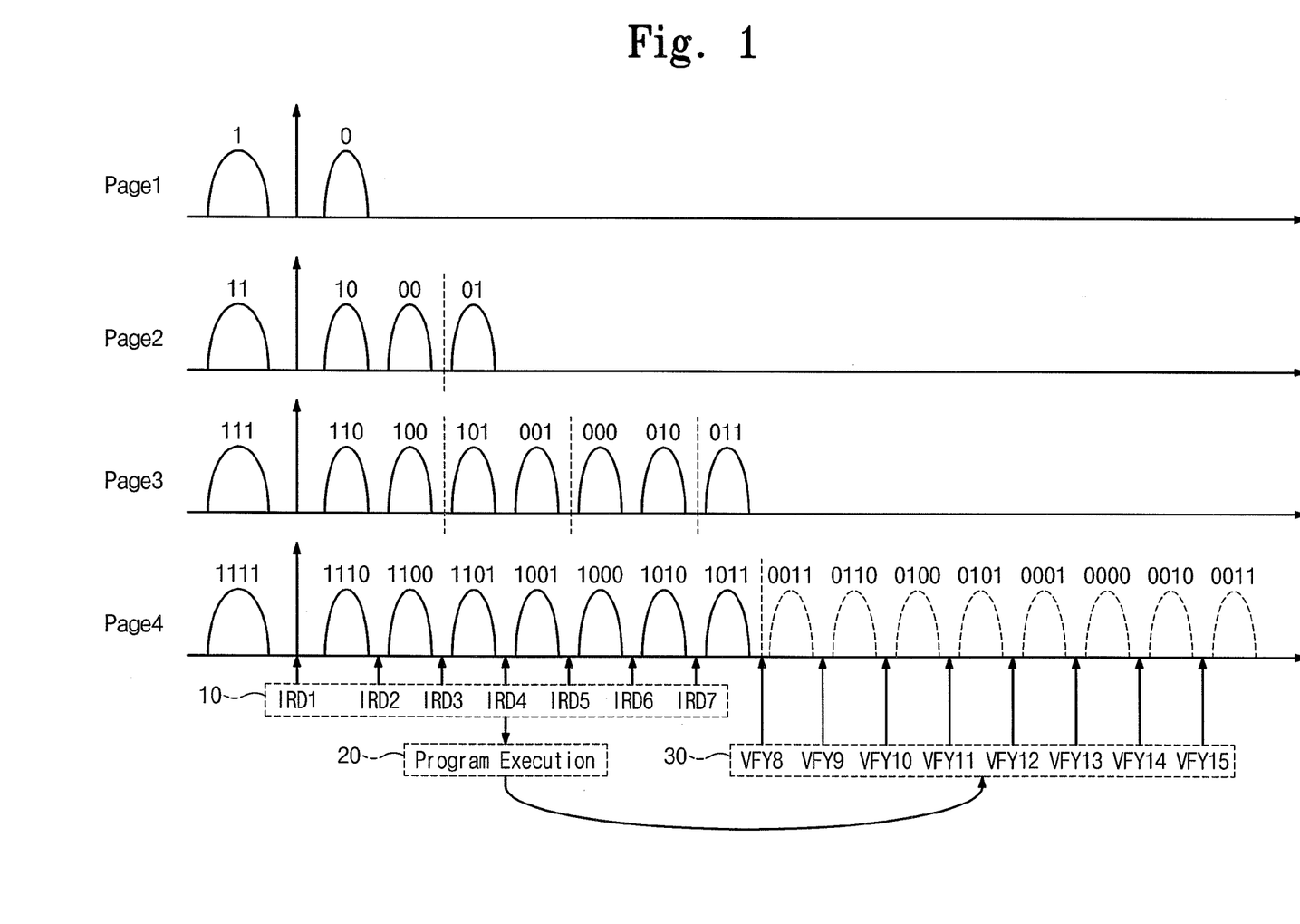
FIG. 1 shows a scheme of programming a 4-bit cell.

FIG. 1 shows a scheme for programming a 4-bit cell. Threshold-voltage distribution profiles show programming steps for programming multi-bit memory cells having 16 threshold voltage states. Here, the data ordering patterns corresponding to the threshold voltage states are featured in the Gray coding arrangement where one bit is converted to another bit during a single programming step. Referring to FIG. 1, the programming operation is carried out by including first through fourth page programming steps (Page-1 program—Page-4 program) that write 4-bit data from a least significant bit (LSB) to a most significant bit (MSB). Each bit of the 4-bit data is input in units of a single page written by the programming operation of one cycle. FIG. 1 shows a programming operation for a multi-bit flash memory device. Here, the multi-bit memory is programmed in 4 pages. The final page ($4^{th}$ page) corresponds to the most significant bit (MSB) page.

In programming the MSB page, the multi-bit flash memory device conducts an initial reading operation for reading programmed results of the previous pages of the memory cells. After finding threshold voltage locations of the memory cells by means of the initial reading operation, the MSB page is programmed with reference to the threshold voltage locations. The initial reading operation for the fourth page programming step is conducted with voltages IRD1-IRD7 (referenced as 10) that are supplied to a word line of the memory cells. After completing the initial reading operation, the multi-bit flash memory device begins to program the memory cells in accordance with a logical value ('1' or '0') of the MSB page. After the programming operation 20, a verifying operation is carried out to determine whether the programming operation 20 has been completed, using verifying voltages 30 corresponding to each of the threshold voltage states. Through the verifying operation, memory cells that have not been fully programmed in a target state of threshold voltages are detected. The memory cells detected as being under-programmed are re-programmed. This repetition of programming and verifying operations continues until all of the memory cells are detected as having passes the verifying operation.

Throughout the programming steps for the pages as shown in FIG. 1, program disturbance due to capacitive coupling effects may be present as relatively high voltages are applied to selected word lines. Further, electrons injected into floating gates by the programming operation may dissipate over time. In this case, the threshold voltage distributions of the memory cells may extend upward or downward.

Figure 2:
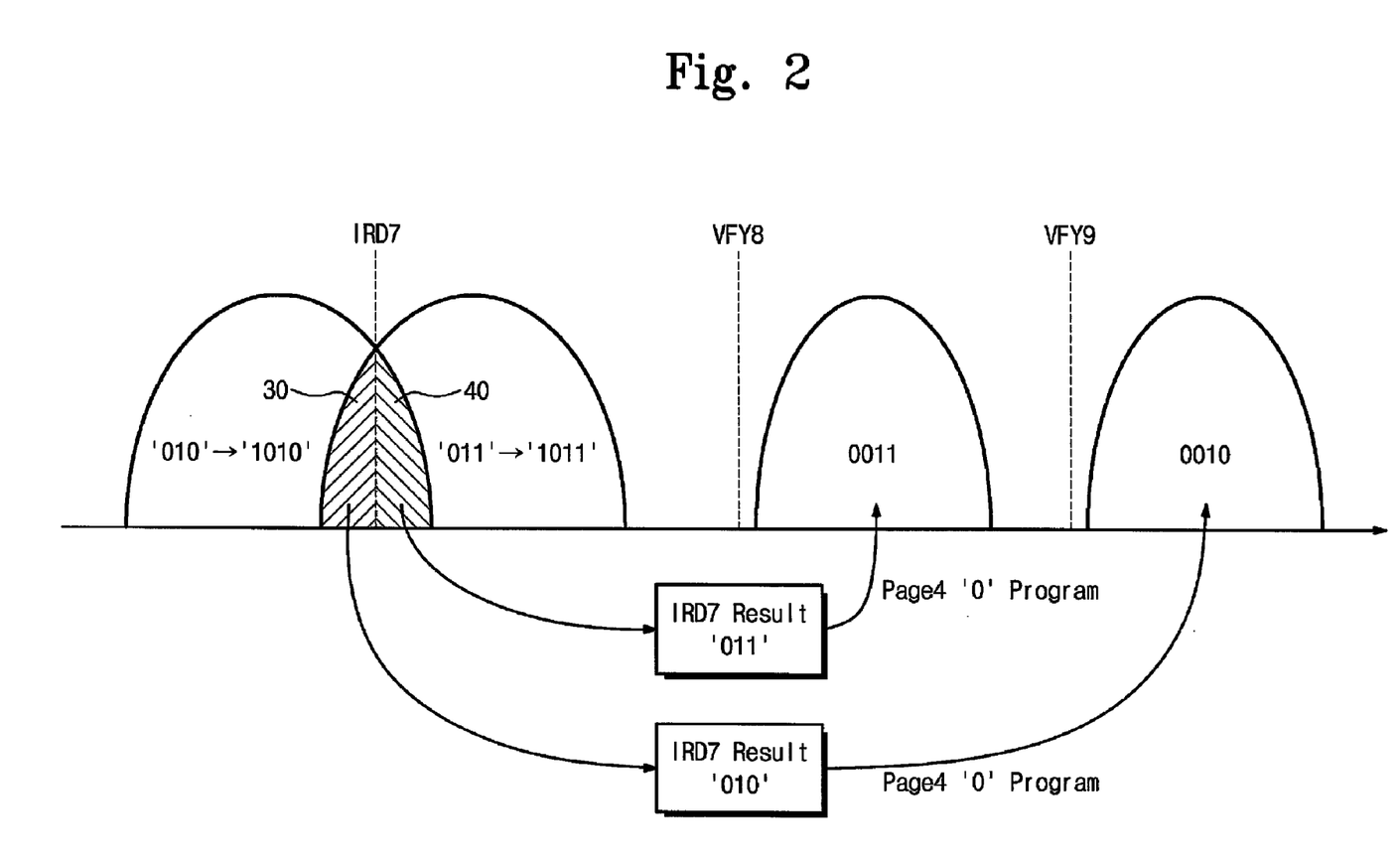
FIG. 2 shows an initial read error arising from the programming scheme shown in FIG. 1.

FIG. 2 shows an extension of the threshold voltage distributions during the programming operation. Referring to FIG. 2, threshold voltage states '010' and '011' are shown having an extended distribution after the third page programming step. The threshold voltage states '010' and '011' include overlapping regions 30 and 40 caused by the extended threshold voltage distributions. Here, the threshold voltage states '010' and '011' are set to be '1010' and '1011' by program inhibition when the fourth page data (or MSB) is '1'. Before the programming operation for the fourth page data, the memory cells corresponding to the threshold voltage states are targeted for the initial reading operation, being read by means of the read voltage IRD7. Unless the initial reading operation is accurately carried out, the reliability of the programming operation with the fourth page data is reduced.

However, the overlapping regions 30 and 40 generated from the threshold voltage states '010' and '011' may cause an erroneous result of the initial reading operation. As illustrated in FIG. 2, memory cells corresponding to the overlapping region 30 are normally included in the threshold voltage state '011'. According to the initial reading operation with the read voltage IRD7, the memory cells included in the overlapping region 30 will be read out in the threshold voltage state '010'. The memory cells with 3-bit initial read data of '010' are programmed in the threshold voltage state '0010' when the fourth page data (or MSB) is '0'. The memory cells with 3-bit initial read data of '010' are programmed in the threshold voltage state '1010' when the fourth page data (or MSB)

is '1'. These programming errors may also occur in the memory cells included in the overlapping region 40.

Figure 3:
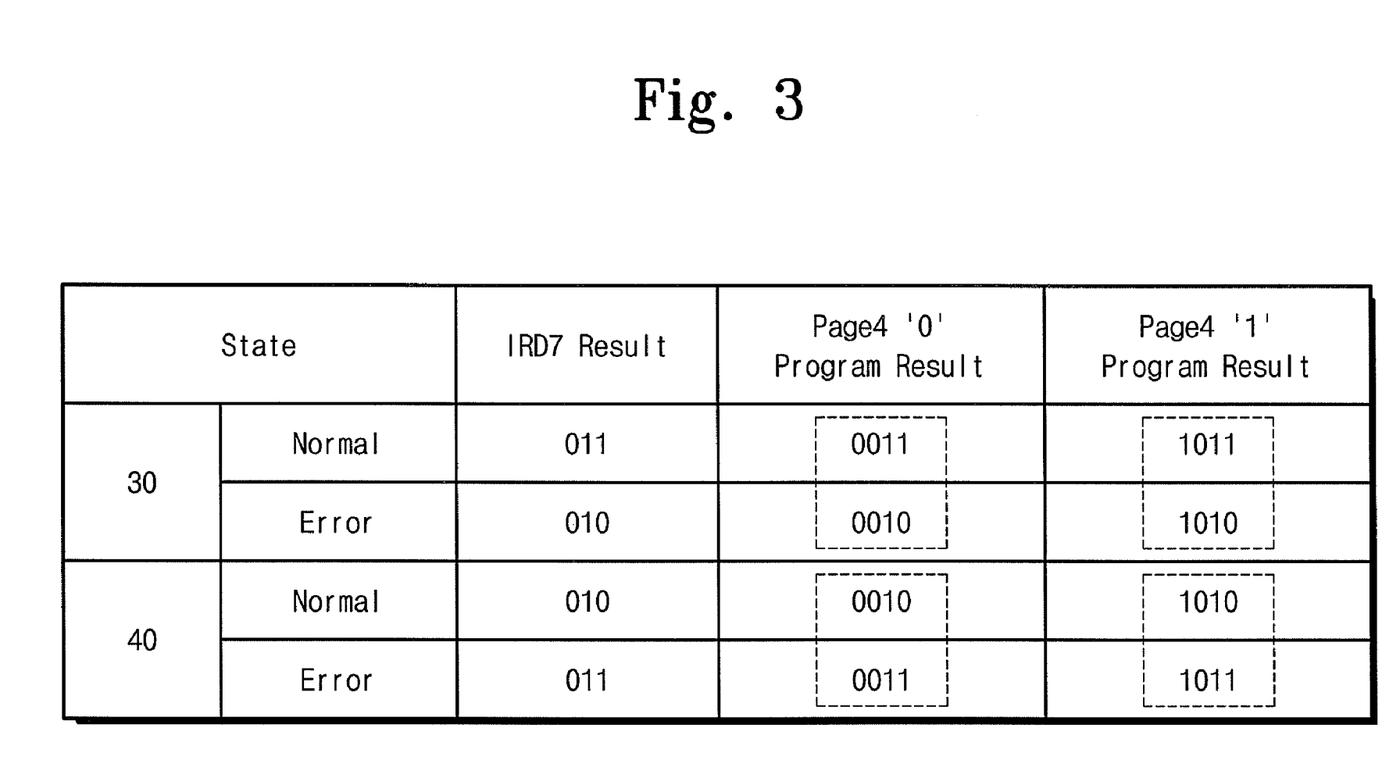
FIG. 3 is a table summarizing results of bit errors arising from the states of FIG. 2.

FIG. 3 is a table summarizing programmed results according to the initial reading operation for the memory cells included in the overlapping regions 30 and 40.

Referring to FIG. 3, due to extension of the threshold voltage distributions, the memory cells of the overlapping region 30 are detected as being in the threshold voltage state '010' by the initial reading operation that looks at the programmed result of the third page. Thus, the memory cells included in the overlapping region 30 are programmed in the threshold voltage states '0010' when the fourth page data is '0'. Without extension of the threshold voltage distributions, the memory cells of '010' are programmed in the threshold voltage state '0011'. The memory cells included in the overlapping region 30 are programmed in the threshold voltage states '1010' when the fourth page data is '1'. Without extension of the threshold voltage distributions, the memory cells of '011' are programmed in the threshold voltage state '1011'.

The memory cells of the overlapping region 40 are detected as being in the threshold voltage state '011' through the initial reading operation. Thus, the memory cells included in the overlapping region 40 are programmed in the threshold voltage states '0011' when the fourth page data is '0', or programmed in the threshold voltage states '1011' when the fourth page data is '1'. Without extension of the threshold voltage distributions, the memory cells of '011' are programmed in the threshold voltage state '0010' or '1010'.

As can be seen from the aforementioned figures, data erroneously read through the initial reading operation of the multi-bit flash memory device may affect the programming operation. While the aforementioned figures illustrate the programming operation for the MSB pages, erroneous results from the initial reading operation are not limited to the types of errors shown. For instance, extension of threshold voltage distributions may occur during a programming operation for the second page (Page-2) or the third page (Page-3). Furthermore, an initial read error is not limited to being caused by extension of threshold voltage distributions in the memory cells. Other reasons, such as noises arising while reading data, may also cause initial read errors. For example, an initial read error arising from a programming operation for the second page (Page-2) affects a programming operation for data of the third page (Page-3) or the fourth page (Page-4). Therefore, a 1-bit error generated from the initial reading operation may give rise to a 2-bit or 3-bit error.

SUMMARY OF THE INVENTION

Exemplary embodiments of the present invention are directed to programming a multi-bit flash memory device. Memory cells of a multi-bit flash memory device may be programmed within target threshold voltage states even when there is an error during a programming operation.

An aspect of the present invention relates to a method for programming a flash memory device with a plurality of memory cells each storing multi-bit data. The method including the steps of reading data from selected memory cells, detecting and correcting an error of the read data, and programming input program data into the selected memory cells with reference to the error-corrected read data.

Each memory cell may store 4-bit data corresponding to first through fourth page data that are input sequentially.

The data may be the first page data or LSB data of the 4-bit data.

The data may be 2-bit data including the first and second pages of data of the 4-bit data.

The data may be 3-bit data including the first, second and third pages of data of the 4-bit data.

The data may include data for error correction.

The program data may be a single page of data of the multi-bit data.

The program data may be MSB page data of the multi-bit data.

Exemplary embodiments of the present invention also provide a method for programming a flash memory device that stores multi-bit data in each of the selected memory cells in single-page units. The method including determining whether a program page is an error correction target page. Data is read from the selected memory cells if the program page is the error correction target page. An error of the read data is detected and corrected. Input data of the program page is programmed into the selected memory cells with reference to the error-corrected read data.

The method may further include reading the data from the selected memory cells if the program page fails to match the error correction target page. The program page data is programmed into the selected memory cells with reference to the read data.

Determining whether a program page is an error correction target page may include detecting a page address of the program page and comparing the page address to an address of the error correction target page.

The error correction target page may correspond to one page among the multi-bit data.

The error correction target page may include at least two pages of the pages included in the multi-bit data.

Another aspect of the present invention relates to a flash memory device including an error correction circuit, a cell array with pluralities of memory cells each storing multi-bit data, a page buffer block configured to conduct reading and programming operations for selected memory cells, and a program controller operating the page buffer block to read and provide first data to the error correction circuit and to program second data into the selected memory cells with reference to the first data that is error-corrected by the error correction circuit.

An exemplary embodiment of the present invention also provides a memory system including a memory controller having an error correction circuit and a multi-bit flash memory device electrically connected to the memory controller. The multi-bit flash memory device includes a cell array with memory cells each storing multi-bit data. A page buffer block reads and programs selected memory cells. A program controller operates the page buffer block to read and provide first data to the error correction circuit and to program second data into the selected memory cells with reference to the first data that is error-corrected by the error correction circuit.

The first data may include error information for detecting and correcting an error.

The cell array may include a field for storing the error information.

The first data of the multi-bit data may be page data which are programmed into the selected memory cells until the second data is programmed.

The page buffer block may include page buffers corresponding to the memory cells, each page buffer having latches for storing the first and second data.

The multi-bit data may be 4-bit data.

The second data may be a single page data of the multi-bit data.

The second data may be MSB data of the multi-bit data, which is programmed last.

The multi-bit flash memory device may further include a voltage generator providing a word line of the selected memory cells with a read voltage for reading the first data or a program voltage for programming the second data.

A further understanding of the nature and aspects of the present invention may be realized by reference to the remaining portions of the specification and the attached figures.

BRIEF DESCRIPTION OF THE DRAWINGS

Non-limiting and non-exhaustive exemplary embodiments of the present invention will be described with reference to the following figures, wherein like reference numerals may refer to like parts throughout the various figures. In the figures.

DETAILED DESCRIPTION OF EXEMPLARY EMBODIMENTS

Exemplary embodiments of the present invention will be described below. The present invention may, however, be embodied in different forms and should not be construed as limited to the embodiments set forth herein. Like reference numerals may refer to like elements throughout the accompanying figures.

Exemplary embodiments of the present invention are described below in conjunction with the accompanying drawings.

Figure 4:
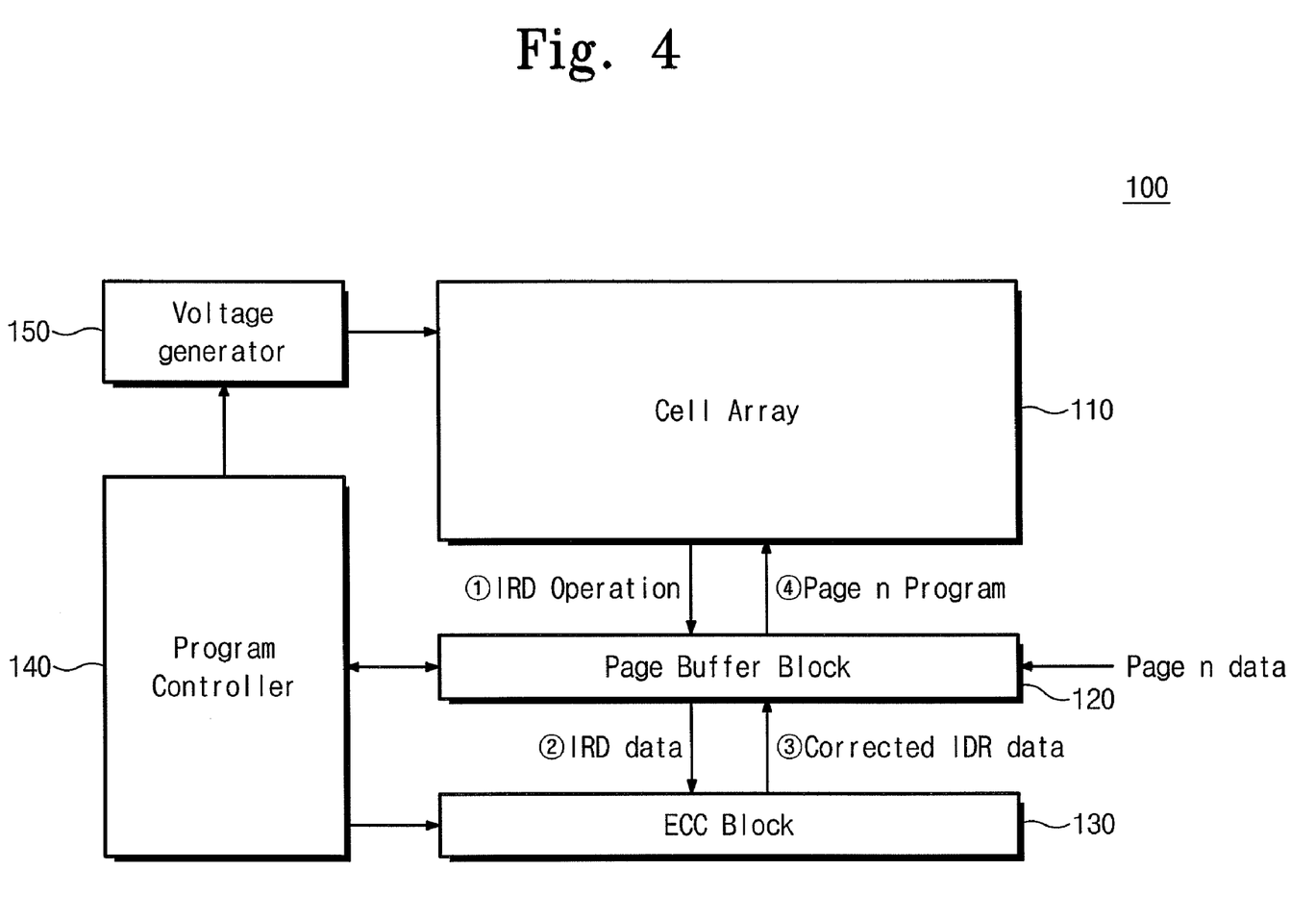
FIG. 4 is a block diagram of a multi-bit flash memory device according to exemplary embodiments of the present invention.

FIG. 4 is a block diagram illustrating a multi-bit flash memory device that may be programmed with a programming method for multi-bit data in accordance with exemplary embodiments of the present invention. Referring to FIG. 4, the multi-bit flash memory device is able to conduct error detection and correction for data temporarily stored in a page buffer block 120 during an initial reading operation. The multi-bit flash memory device is comprised of an error correction circuit (ECC) block 130.

A cell array 110, as aforementioned in connection with FIG. 1, includes multi-bit flash memory cells capable of storing m-bit data (m is an integer larger than 2). In an exemplary embodiment, the cell array 110 includes 4-bit flash memory cells. Multi-bit flash memory cells are generally programmed to one of a plurality of threshold voltage states so as to store plural bits in a unit cell. The multi-bit flash memory device is operable with sufficient margins between the threshold voltage states by the use of a programming method and circuit technology. The multi-bit flash memory cells contain the multiple threshold voltage states. There are $2^k$ threshold voltage states where k corresponds to the number of the bits stored. As the density of the flash memory increases, the intervals between the threshold voltage states of the multi-bit flash memory cells may be narrowed and the read margins between the threshold voltage state may be reduced.

The page buffer block 120 functions as either a writing driver or a sensing amplifier in accordance with an operation mode. For instance, the page buffer block 120 operates as a sensing amplifier in a reading operation mode, and operates as a writing driver in a programming operation mode. The page buffer block 120 conducts the initial reading operation for detecting programmed states of the memory cells by a program controller 140 (1). The page buffer block 120 latches 1-bit or 3-bit data read out through sequential steps of the initial reading operation for the programmed states of the memory cells in accordance with read voltages IRD1-IRD7. At the same time, error correction codes (e.g., parity bits) programmed in the cell array for error correction are also latched in the page buffer block 120. Thereafter, the page buffer block 120 provides the ECC block 130 with the data and error correction codes read out through the initial reading operation (2). The ECC block 130 detects and corrects error bits included in the initial read data (IRD) transferred thereto. The error-corrected initial read data (IRD) are then returned to the page buffer block 120 (3). The page buffer block 120 operates to program page data, which are provided for programming, in the memory cells with reference to the error-corrected and returned initial read data (IRD) (4).

The ECC block 130 detects the number and locations of error bits of the initial read data (IRD) with reference to the error correction codes. The error bits found by the process of error correction are corrected and transferred to the page buffer block 120. Here, the ECC block 120 may be comprised in the multi-bit flash memory device. Otherwise, the ECC block 130 may be provided to a memory controller located outside of the multi-bit flash memory device.

The program controller 140 controls the page buffer block 120 and a voltage generator 150 to program the cell array 110 with program data sequentially input thereto. The program controller 140 operates the voltage generator 150 to provide the read voltages IRD1-IRD7 to word lines of the memory cells for the initial reading operation. The program controller 140 operates the page buffer block 120 to latch the error correction codes and the initial read data sensed by the read voltages IRD1-IRD7. The program controller 140 also controls the voltage generator 150 and the page buffer block 120 to verify programmed results. During the verifying operation, the program controller 140 operates the page buffer block 120 to sense signals from the memory cells in response to verification voltages VFY8-VFY15. With reference to the results of the verification, the program controller 140 determines whether to continue the sequence of programming.

The voltage generator 150 generates an incremental step-pulse program (ISPP) voltage for programming the memory cells, various levels of the initial read voltages IRD1-IRD7 and the verification voltages VFY8-VFY15, under the control of the program controller 140. The voltages output from the voltage generator 150 are provided to the word lines of the cell array 110 by the program controller 140.

As aforementioned, the multi-bit flash memory device according to exemplary embodiments of the present invention is configured to conduct the initial read that is carried out during the programming operation for a specific page, and the error detection and correction for data read out by the initial reading operation. Thereby, error accumulation and propagation may be prevented by loading the error-corrected initial read data into the page buffer block 120 and programming the page data.

Figure 5:
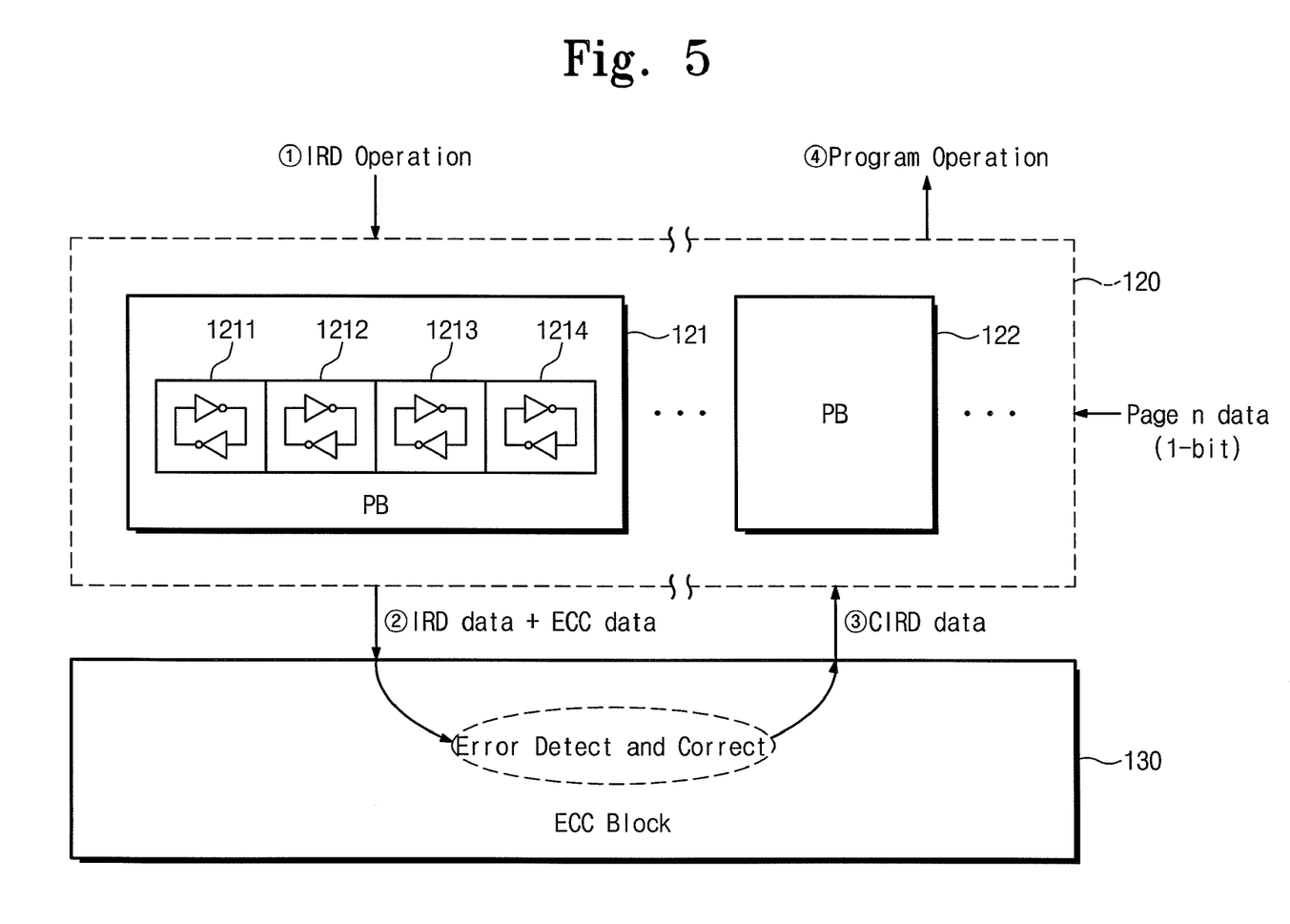
FIG. 5 is a block diagram illustrating an organization and operation of the page buffer block shown in FIG. 4.

FIG. 5 is a block diagram illustrating an organization and operation of the page buffer block 120 and the ECC block 130 shown in FIG. 4. Referring to FIG. 5, the multi-bit flash memory device according to exemplary embodiments of the present invention operates by the program controller 140, including page buffers 121-122 each of which includes a plurality of latches 1211-1214 corresponding to a unit flash memory cell. While this exemplary embodiment includes the programming operation for a unit memory cell, in other exemplary embodiments, the programming operation may be carried out with a plurality of page buffers corresponding to the unit page.

The initial reading operation (1) is conducted to find current threshold voltage states of the memory cells. Using the initial read voltages IRD1-IRD7 for the initial reading operation, data are read out by reading the threshold voltage states of the memory cells. The initial read data (IRD) are stored in the page buffer 121 including at least four latches 1211-1214. If a page to be programmed corresponds to the second page data, the initial read data (IRD) is 1-bit data. In this case, the 1-bit initial read data (IRD) is stored in one of the latches, e.g., 1211, in the page buffer 121. If a page to be programmed corresponds to the third page data, the initial read data (IRD) is 2-bit data. In this case, the 2-bit initial read data (IRD) are stored in two of the latches, e.g., 1211 and 1212, in the page buffer 121. If a page to be programmed corresponds to the fourth page data, the initial read data (IRD) is 3-bit data. In this case, the 3-bit initial read data (IRD) are stored in three of the latches, e.g., 1211, 1212, and 1213, in the page buffer 121.

During the initial reading operation (1), the error correction data (ECC) are read out from a specific field (e.g., a spare field) of the cell array 110. The error correction data (ECC) are stored in the page buffer 122 that latches the error correction data.

The initial read data (IRD) and the error correction data (ECC) stored each in the page buffers 121 and 122 by the initial reading operation (1) are transferred to the ECC block 130 (2). The ECC block 130 detects error bits from the initial read data (IRD) with reference to the error correction data (ECC). If there is an error, the EEC block 130 corrects the error. Non-erroneous or error-corrected initial read data (CIRD) are stored again in the latches 1211-1213 of the page buffer 121 (3). During this storing, a page data (Page-n data) to be programmed is loaded into one (e.g., 1214) of the four latches.

After the CIRD is transferred to the page buffer 121 and the program page data (Page-n data) is loaded, the program controller enables the programming operation for the memory cells.

By such a programming mode of the multi-bit flash memory device conducting the initial reading and error-correction operations, an error occurring from the initial reading operation can be removed during the programming operation.

Figure 6:
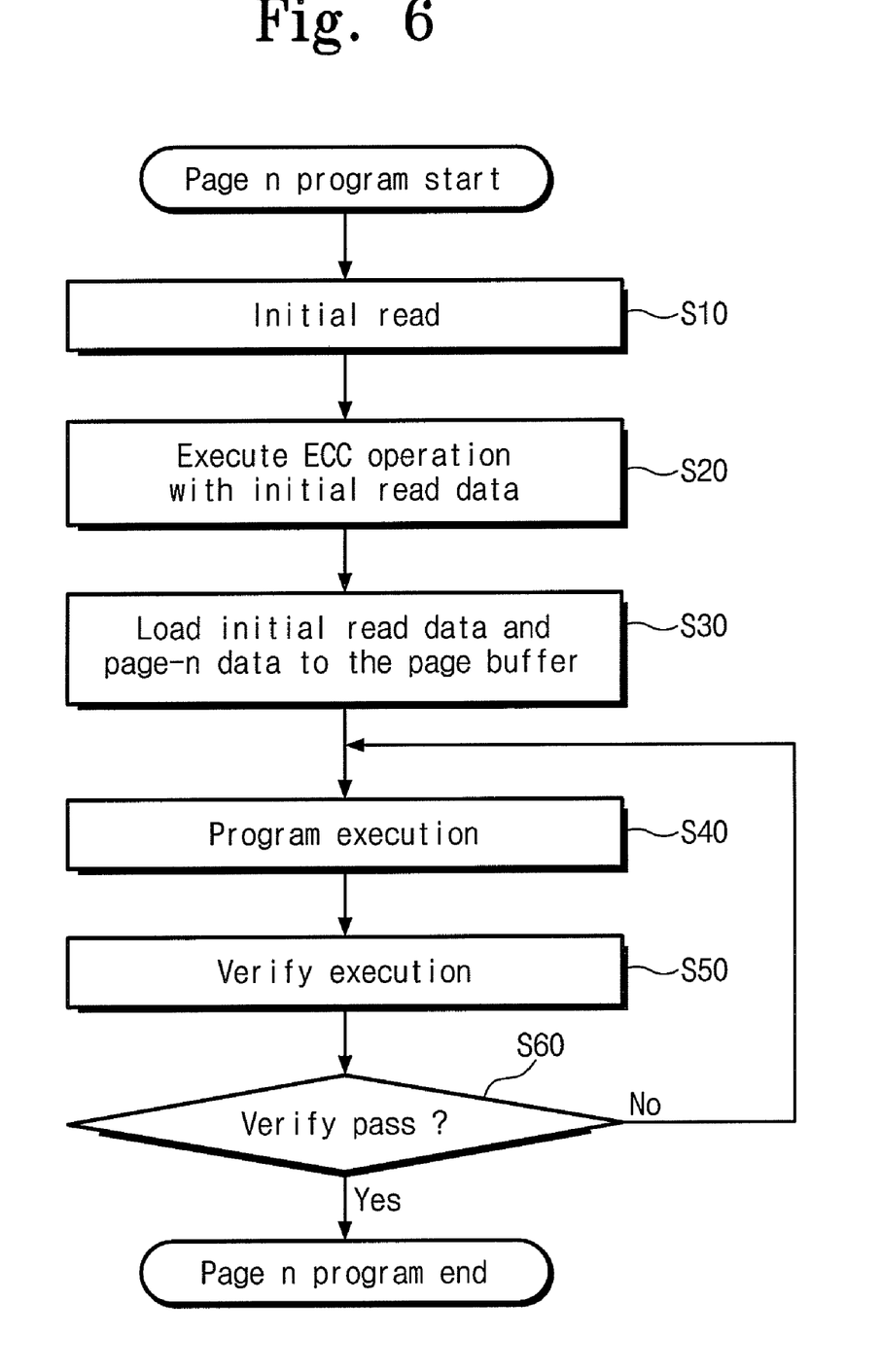
FIG. 6 is a flow chart showing a programming method of the multi-bit flash memory device in accordance with exemplary embodiments of the present invention.

FIG. 6 is a flow chart showing a programming method of the multi-bit flash memory device in accordance with exemplary embodiments of the present invention. The flow chart of FIG. 6 shows a programming procedure where the page data is sequentially provided. The flow chart of FIG. 6 is not restricted to the programming operation of the MSB page and other pages of the multi-bit data may be similarly programmed.

After completing a programming operation for the (n−1)'th page data, the multi-bit flash memory device 100 begins the next programming operation for the n'th page data. The program controller 140 controls the page buffer block 120 and the ECC block 130, conducting the initial read for selected memory cells and executing the error correction for the IRD output through the initial read, for example, as described below.

The program controller 140 controls the page buffer block 120 to conduct the initial reading operation for reading programmed results from the first page to the (n−1)'th page. During the initial reading operation, the IRD read from the selected memory cells and the ECC data stored in the specific field of the cell array are latched in the page buffer block 120 (S10). The IRD and ECC data latched in the page buffer block 120 are transferred to the ECC block 130. The ECC block 130 detects and corrects an error contained in the IRD in response to an operation of the program controller 140 (S20). The error-corrected IRD (CIRD) from the ECC block 130 are loaded into the page buffer block 120 by the program controller 140. The n'th page data provided for programming are also loaded into the corresponding page buffer along with the CIRD (S30). After loading the program data (Program-n data) and the CIRD into the page buffer block 120, the program controller 140 begins the programming operation. The program controller 140 controls the page buffer block 120 to provide bit lines of the selected memory cells with voltages corresponding to the n'th page data. At substantially the same time, the program controller 140 controls the voltage generator 150 to supply a program voltage to a word line of the selected memory cells (S40). After completing the programming operation for the selected memory cells (e.g., memory cells in the page), the program controller 140 controls the voltage generator 150 and the page buffer block 120 to conduct the verifying operation using the verification voltages VFY8-VFY15 (S50). The program controller 140 checks completion of the programming operation with reference to data latched in the page buffer block 120 by the verifying operation (S60). If it determines threshold voltages of the memory cells are within a target distribution range, the program controller 140 terminates the programming operation with the n'th page data. If the verifying operation detects that the programming has failed, the procedure returns to the program execution step S40 for reprogramming the selected memory cells.

According to the aforementioned programming method of the multi-bit flash memory device, described with respect to the flow chart of FIG. 6, the error detection and correction to the IRD is latched in the page buffer block 120 by the initial reading operation. The next page data are then programmed into memory cells with reference to the CIRD. Thus, the programming method of the multi-bit flash memory device according to exemplary embodiments of the present invention is carried out while preventing the propagation of error by interrupting an error generated while reading the IRD.

Figure 7:
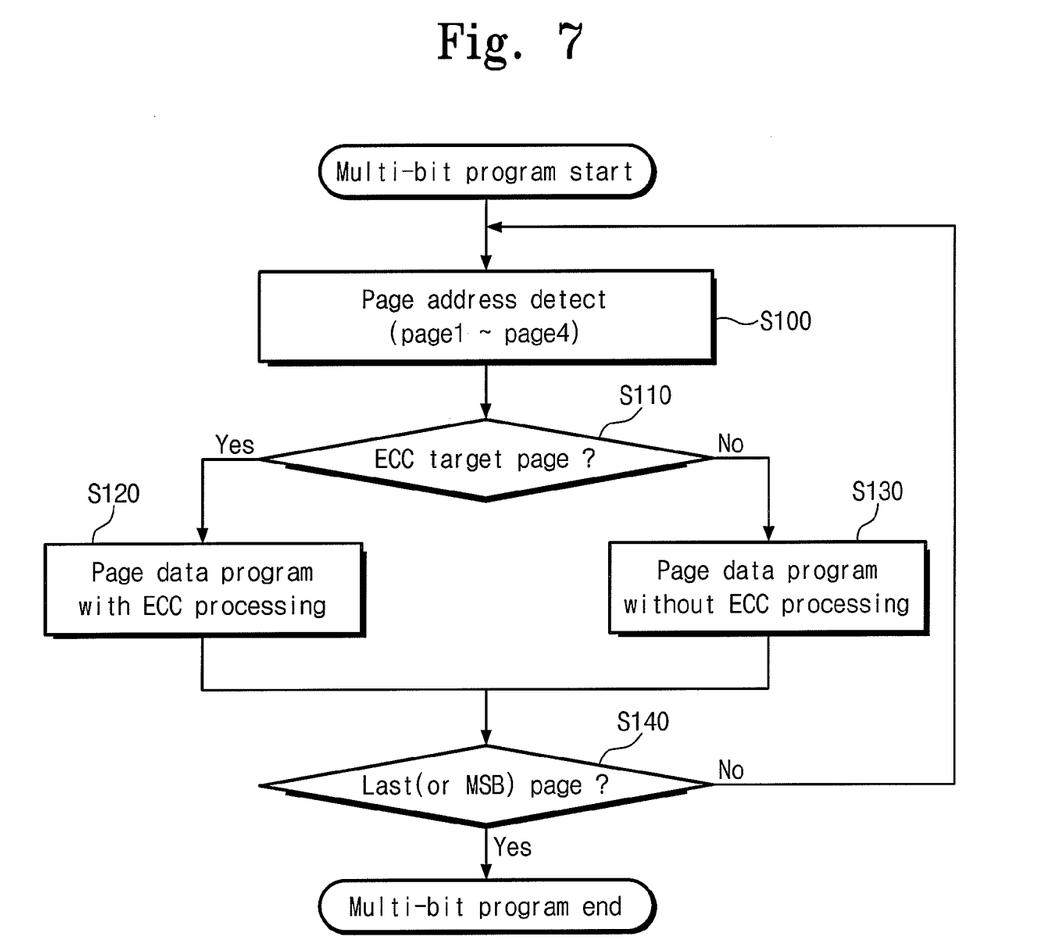
FIG. 7 is a flow chart showing a programming method of multi-bit data in the multi-bit flash memory device in accordance with exemplary embodiments of the present invention.

FIG. 7 is a flow chart showing a method for programming multi-bit data in a multi-bit flash memory device in accordance with an exemplary embodiment of the present invention. The method is described with respect to a selected page, however additional pages may be similarly programmed. Referring to FIG. 7, the multi-bit flash memory device performs error detection and correction during a programming operation for one page data of the multi-bit data. This operational scheme helps to minimizing time needed for detecting and correcting an error, and increases the reliability and speed of the programming operation, for example, as described below.

The program controller 140 detects a program command and an address that are provided to the device before an input of program data (S100). With reference to a detected row address, the program controller 140 determines whether a current page is a predetermined target page for error detection and correction (for example, ECC target page). From the determination, the program controller 140 selects the programming mode described by FIG. 6 or a general multi-bit programming mode without error detection and correction (S110). If an ECC target page is set to the fourth page (Page-4), the program controller 140 performs error detection and correction for initial read data while inputting the fourth page data (S120). Otherwise, when there is an input of the first or third page data, not corresponding to the ECC target page, the program controller 140 conducts the programming, excluding the operation of error detection and correction for the initial read data (S130). After completing the programming operation of the input page data, the program controller 140 determines whether the programmed page data corresponds to the final page (the MSB page) among the multi-bit data (S140). If the programmed page data is the final page data, the programming operation of the multi-bit data for the selected memory cells is terminated. Unless the programmed page data is the final page data, the program controller 140 returns to step S100 for detecting the next page address.

The procedure of FIG. 6 is carried out for one page data of the multi-bit data. In the steps shown in FIG. 7, multi-bit data programming may be performed for each page in accordance with the steps shown in FIG. 6.

Figure 8:
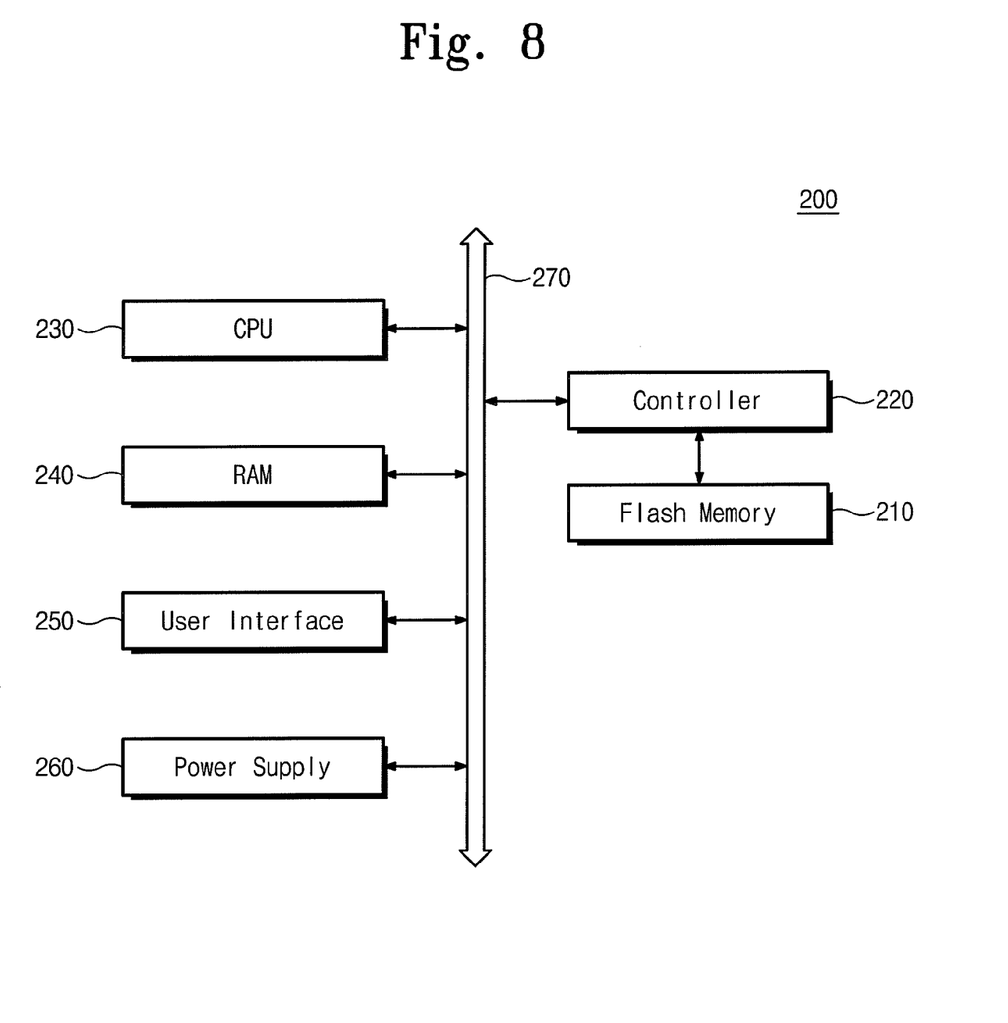
FIG. 8 is a block diagram of a memory system embedding the multi-bit flash memory device in accordance with exemplary embodiments of the present invention.

FIG. 8 is a block diagram of a system embedding the multi-bit flash memory device according to exemplary embodiments of the present invention. Referring to FIG. 8, the multi-bit flash memory device may be embedded in a system such as a mobile apparatus or a desktop computer. The system may include a central processing unit (CPU) 230, a random access memory (RAM) 240, a user interface 250, a power supply 260, a memory controller 220, and a flash memory device 210. The flash memory device 210 may be configured similarly to the aforementioned multi-bit flash memory device. The flash memory device 210 stores data that are provided through the user interface 250 or data processed through the CPU 230 by the memory controller 220. While the multi-bit flash memory device 210 and the memory controller 220 are illustrated as being independent from each other, the memory controller 220 may be included in the multi-chip flash memory device 210. Although not shown in FIG. 8, the system may be further equipped with an application chipset, or a camera image processor.

According to exemplary embodiments of the present invention, a program fail due to error accumulation by adding an operation for correcting an error of initial read data during a programming mode in a multi-bit flash memory device may be minimized.

The above-disclosed subject matter is to be considered illustrative, and not restrictive, and the appended claims are intended to cover all such modifications, enhancements, and other embodiments, which fall within the true spirit and scope of the present invention.

What is claimed is:

1. A method for programming a flash memory device including a plurality of memory cells, each storing multi-bit data, the method comprising:
    reading data from selected memory cells of the plurality of memory cells;
    detecting and correcting an error within the read data; and
    programming input program data into the selected memory cells based upon the error-corrected read data.

2. The method as set forth in claim 1, wherein each of the plurality of memory cells stores 4-bit data corresponding to first through fourth page data that are each input sequentially.

3. The method as set forth in claim 2, wherein, reading the data from the selected memory cells includes reading the first page data.

4. The method as set forth in claim 2, wherein, reading the data from the selected memory cells includes reading 2-bit data including the first and second page data.

5. The method as set forth in claim 2, wherein, reading the data from the selected memory cells includes reading 3-bit data including the first, second and third page data.

6. The method as set forth in claim 1, wherein, reading the data from the selected memory cells includes, reading data for error correction.

7. The method as set forth in claim 1, wherein the data from the selected memory cells is a single page of data of the plurality of memory cells that each store multi-bit data.

8. The method as set forth in claim 1, wherein the input program data is MSB page data.

9. A method for programming a flash memory device that stores multi-bit data in each of a plurality of selected memory cells, the method comprising the steps of:
    determining whether a program page is an error correction target page;
    reading data from the selected memory cells when the program page is the error correction target page;
    detecting and correcting an error of the data read from the selected memory cells; and
    programming input data of the program page into the selected memory cells based upon the error-corrected data.

10. The method as set forth in claim 9, wherein, when it is determined that the program page is not the error correction target page, the method additionally comprises:
    reading the data from the selected memory cells; and
    programming the input data of the program page into the selected memory cells based upon the data read from the selected memory cells.

11. The method as set forth in claim 9, wherein the step of determining whether a program page is an error correction target page comprises detecting a page address of the program page and comparing the page address to an address of the error correction target page.

12. The method as set forth in claim 9, wherein the error correction target page corresponds to a single page of the multi-bit data.

13. The method as set forth in claim 9, wherein the error correction target page includes at least two pages of the multi-bit data.

14. A method for programming a flash memory device comprising:
    controlling a page buffer block, configured to conduct reading and programming operations for selected memory cells, to read and provide first data to an error correction circuit and to program second data into selected memory cells based upon the first data that is error-corrected by the error correction circuit.

15. The method as set forth in claim 14, wherein the first data includes error information for detecting and correcting an error.

16. The method as set forth in claim 14, wherein the first data is a single page of data of the multi-bit data that is programmed into the selected memory cells.

17. The method as set forth in claim 16, wherein the page buffer block comprises a plurality of page buffers each corresponding to each of the plurality of memory cells, each page buffer having a plurality of latches for storing the first and second data.

18. The method as set forth in claim 14, wherein the multi-bit data is 4-bit data.

19. The method as set forth in claim 14, wherein the second data is a single page of data of the multi-bit data.

20. The method as set forth in claim 14, wherein the second data is MSB data of the multi-bit data.

* * * * *